United States Patent
Kondo et al.

(10) Patent No.: US 7,497,906 B2
(45) Date of Patent: Mar. 3, 2009

(54) SEED CRYSTAL FIXING APPARATUS AND A METHOD FOR FIXING THE SEED CRYSTAL

(75) Inventors: Daisuke Kondo, Kodaira (JP); Takuya Monbara, Iruma (JP)

(73) Assignee: Bridgestone Corporation, Tokyo (JP)

( * ) Notice: Subject to any disclaimer, the term of this patent is extended or adjusted under 35 U.S.C. 154(b) by 46 days.

(21) Appl. No.: 11/683,745

(22) Filed: Mar. 8, 2007

(65) Prior Publication Data
US 2007/0209580 A1    Sep. 13, 2007

(30) Foreign Application Priority Data
Mar. 8, 2006   (JP) ............................ P2006-062974
Mar. 8, 2006   (JP) ............................ P2006-063036

(51) Int. Cl.
*C30B 25/12*   (2006.01)

(52) U.S. Cl. ........................ 117/109; 117/200; 117/216; 117/930

(58) Field of Classification Search ................. 117/109, 117/200, 216, 930
See application file for complete search history.

(56) References Cited

FOREIGN PATENT DOCUMENTS

| JP | 2001-139394 A | 5/2001 |
|----|---------------|--------|
| JP | 2003-119098 A | 4/2003 |

OTHER PUBLICATIONS

Machine English translation of JP 2001-139394.
Machine English translation of JP 2003-119098.

*Primary Examiner*—Felisa C Hiteshew
(74) *Attorney, Agent, or Firm*—Sughrue Mion, PLLC

(57) ABSTRACT

A seed crystal fixing apparatus for fixing the seed crystal on the seed crystal setting part of a reaction vessel with interposition of the adhesive, has a chamber configured to place the seed crystal setting part and form a hermetic atmosphere within the chamber; and a pressure part placed within the chamber for uniformly applying a pressure on the entire surface of the seed crystal.

6 Claims, 9 Drawing Sheets

10mm

10mm

SEED CRYSTAL FIXING APPARATUS AND A METHOD FOR FIXING THE SEED CRYSTAL

RELATED APPLICATION

This application claims benefit of priority under 35 USC 119 based on Japanese Patent Application P2006-62974, filed Mar. 8, 2006, and Japanese Patent Application P2006-63036, filed Mar. 8, 2006, the entire contents of which are incorporated by reference herein.

BACKGROUND OF THE INVENTION

1. Field of the Invention

The present invention relates to a seed crystal fixing apparatus for fixing a seed crystal to a seed crystal setting part of a reaction vessel with interposition of an adhesive, and a method for fixing the seed crystal.

2. Related Art

Silicon carbides have larger band gap and more excellent in dielectric breakdown property, heat resistance, radiation resistance and the like as compared with silicon, therefore, have been noticed as electronic device materials such as portable and high output semiconductors and the like, and due to excellent optical properties, noticed as optical device materials. Among such silicon carbide crystals, silicon carbide single crystals have a merit that they are particularly excellent in uniformity of properties in wafer when applied to devices such as wafers and the like as compared with silicon carbide polycrystals.

As a method of producing the above-mentioned silicon carbide single crystal, Improved Rayleigh method (improved sublimation re-crystallization method) is known in which a graphite crucible is used, a silicon carbide powder is sublimated and a silicon carbide single crystal is grown on a seed crystal of a silicon carbide single crystal.

When the seed crystal is grown without being completely bonded to the seed crystal setting part in improved Lely method, macroscopic defects (void defects) penetrate through the seed crystal from the side of the seed crystal setting part where the seed crystal is not completely bonded into the growing crystal, and the quality of the wafer was liable to be impaired. Since the adhesive is gasified at high temperatures, it has been also conjectured that remaining bubbles of the gasified adhesive in the adhesive layer causes deterioration of the quality of the crystal.

Several techniques have been proposed for solving the above-mentioned problems (for example, see Japanese Patent Application Laid-Open Nos. 2001-139394 and 2003-119098). Japanese Patent Application Laid-Open No. 2001-139394 discloses, for example, a method for fixing the seed crystal by applying a given pressure. Japanese Patent Application Laid-Open No. 2003-119098 discloses a fixing method for press-bonding the seed crystal by mounting a weight on the seed crystal.

However, it was difficult to uniformly bond the entire surface of the seed crystal by the mechanical press-bond method which cause the surface of the seed crystal finely roughened. Uniform press-bonding with a weight was also difficult.

SUMMARY OF THE INVENTION

First embodiment of this invention is a seed crystal fixing apparatus for fixing the seed crystal on the seed crystal setting part of a reaction vessel with interposition of the adhesive, having a chamber configured to place the seed crystal setting part and form a hermetic atmosphere within the chamber; and a pressure part placed within the chamber for uniformly applying a pressure on the entire surface of the seed crystal.

Second embodiment of this invention is a method of fixing a silicon carbide single crystal on a seed crystal fixing part, comprising: placing a silicon carbide single crystal on a seed crystal fixing part with interposition of an adhesive; applying a uniform pressure on the entire surface of the seed crystal by contacting a flexible bag which is inflatable and deflatable to the seed crystal by charging a gas into the flexible bag; and hardening the adhesive.

Third embodiment of this invention is a method of fixing a silicon carbide single crystal on a seed crystal fixing part, having placing a silicon carbide single crystal on a seed crystal fixing part with interposition of an adhesive within a hermetic atmosphere; and forming the reduced pressure atmosphere within the hermetic atmosphere; and heat-hardening the adhesive.

DETAILED DESCRIPTION OF PREFERRED EMBODIMENTS

Figure 1A:
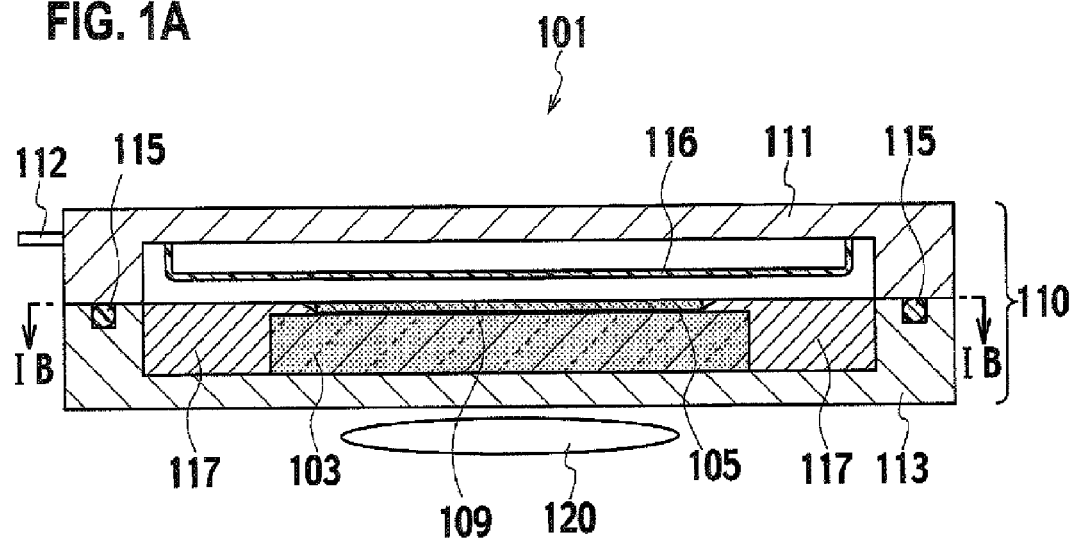
FIG. 1A shows a schematic illustration of the seed crystal fixing apparatus housing a seed crystal fixing part on which a seed crystal is fixed with interposition of an adhesive.

While the present invention is described below with reference to embodiments, it is needless to say that the invention is not restricted to the embodiments as set forth below. Those parts having the same functions in the drawings are given the same reference numerals, and descriptions thereof are omitted.

(Seed Crystal Fixing Apparatus)

Figure 1B:
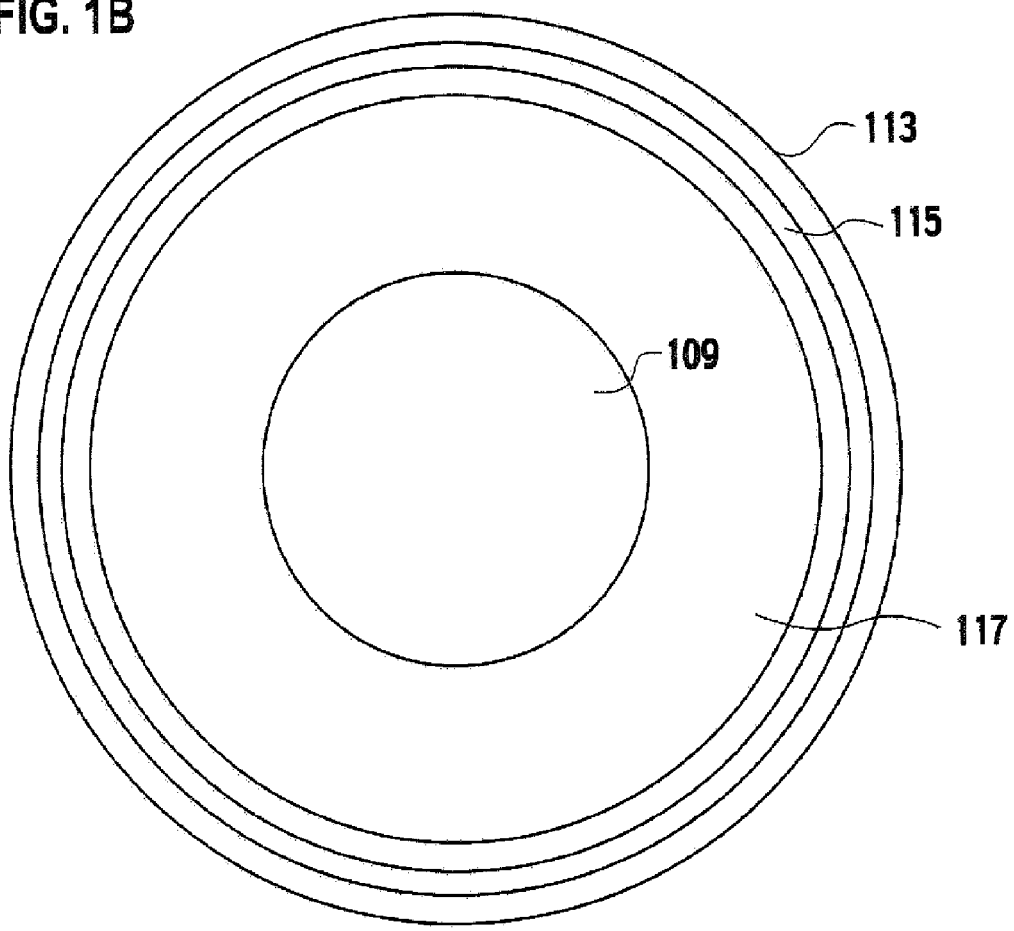
FIG. 1B shows a top view of the lower chamber.

FIG. 1A shows a schematic cross section of a seed crystal fixing apparatus 101 in which a seed crystal setting part 103 on which a seed crystal 109 is placed with interposition of an adhesive 105 is housed, and FIG. 1B shows a top view of a lower chamber. As shown in FIG. 1A, the seed crystal fixing apparatus 101 according to this embodiment is provided for fixing the seed crystal 109 on the seed crystal setting part 103 of a reaction vessel with interposition of the adhesive 105, and has a chamber 110 for forming a hermetic atmosphere so as to enable the seed crystal setting part 103 to be placed within the chamber, and a flexible bag 116 disposed within the chamber 110 for inflation and deflation upon charge and discharge of an air and for uniformly applying a pressure on the entire surface of the seed crystal in contact with the surface of the seed crystal upon inflation. The seed crystal fixing apparatus 101 further has a heating body 120 for hardening the adhesive by heating.

Figure 10:
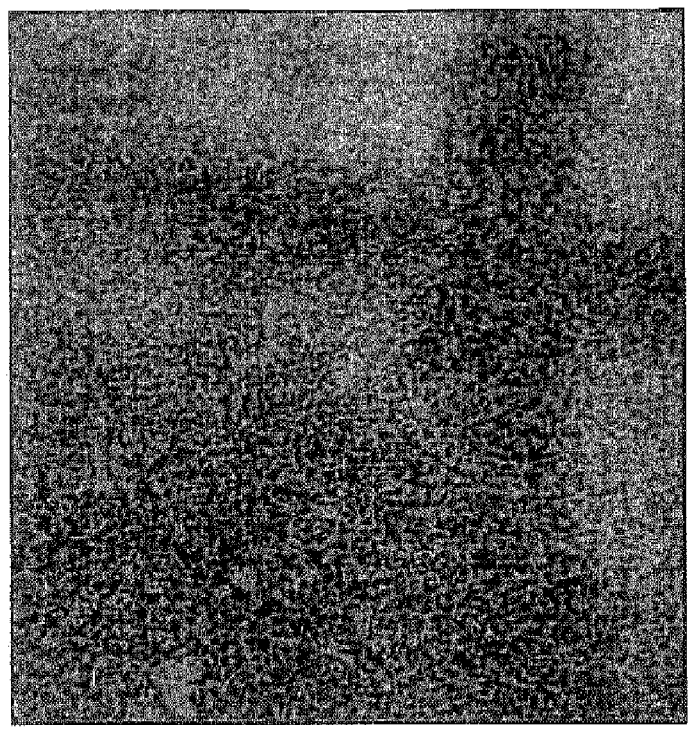
FIG. 10 shows a magnified photograph of the surface of the silicon carbide single crystal obtained in the comparative example.
Figure 14A:
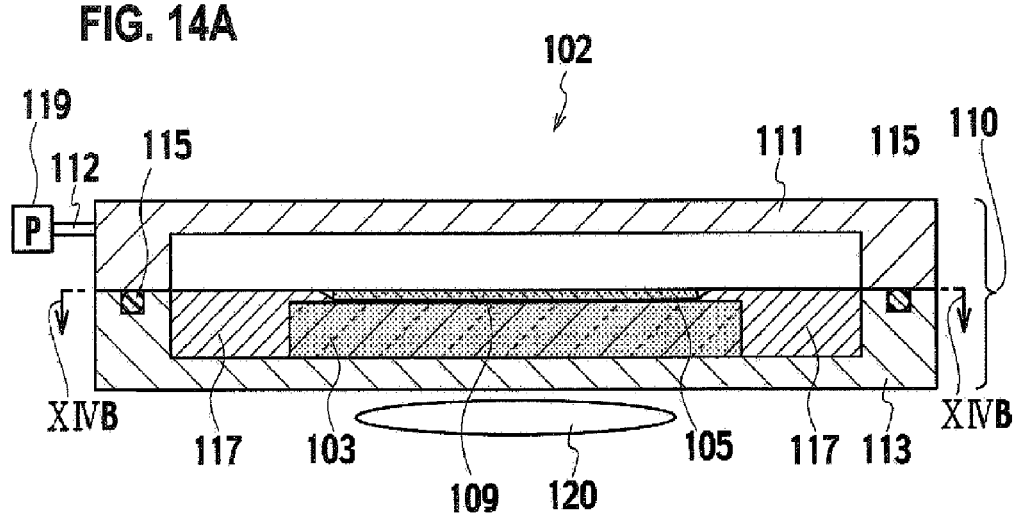
FIG. 14A shows a schematic illustration of the seed crystal fixing apparatus housing a seed crystal fixing part on which a seed crystal is fixed with interposition of an adhesive.

The chamber 110 has an upper chamber 111 and a lower chamber 113 configured to be freely attachable and detachable. The chamber is constructed so that, upon use, the hermetic atmosphere is formed by mounting the upper chamber 111 on the lower chamber 113 with interposition of an O-ring 115 placed on the outer circumference of the lower chamber 113. An evacuation port 112 is provided on the chamber 110, and the pressure is reduced by evacuating air from within the chamber 110 in which the hermetic environment is formed. An evacuation part 119 can be provided as shown in FIG. 14A. The lower chamber 113 has a guide 117 for fixing the seed crystal setting part 103 as well as the seed crystal 109 as shown in FIGS. 10A and 10B. The guide 117 is fixed to the lower chamber so as to be freely attachable and detachable after housing the seed crystal setting part 103 in the lower chamber 113, and the seed crystal 109 is placed onto the seed crystal setting part 103.

Figure 12A:
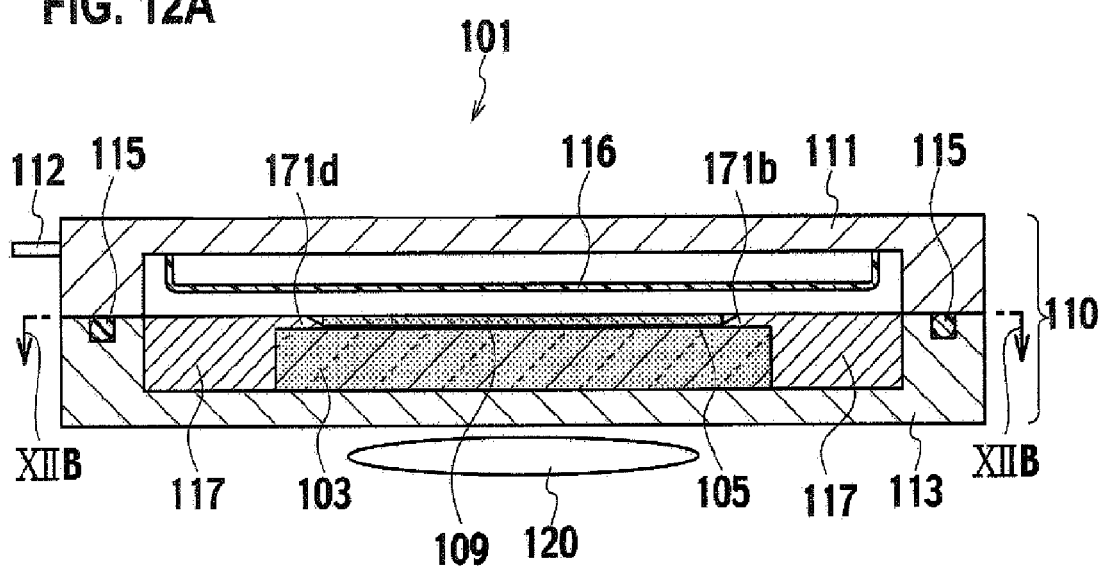
FIG. 12A shows a schematic illustration of the cross-section of a modified example of the seed crystal fixing apparatus housing the seed crystal fixing part on which the seed crystal is fixed with interposition of an adhesive.
Figure 12B:
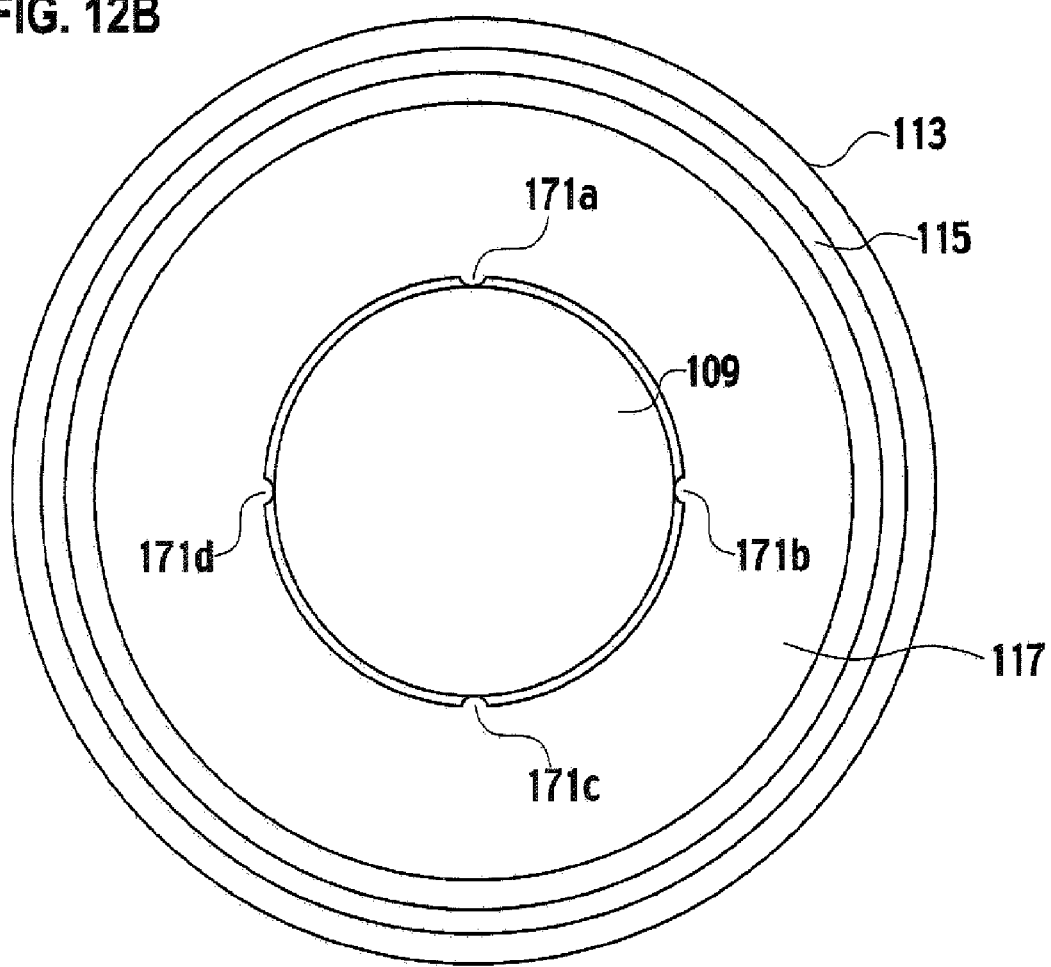
FIG. 12B shows a top view of the lower chamber.

The guide 117 preferably contacts the side face of the seed crystal 109 at least at three points, in order to prevent the adhesive 105 overflowed out of the seed crystal 109 from being adhered and hardened on the guide 117 to make the seed crystal 109 to be hardly peeled from the guide 109. Specifically, jaws 171a to 171d are provided on the guide 117 so as to hold the seed crystal 109 at these four points as shown in FIG. 12B. The shape of the jaws 171a to 171d is not restricted to the semi-circle as shown in the top view of FIG. 12B. Instead, the shape may be an approximate triangle having a tip tapered in the direction of contact point with the seed crystal 109. The shape of the jaws 171a to 171d is preferably approximately equilateral triangle so that the seed crystal is readily pressed with the flexible bag 116. The surface of the guide 117 is preferably coated with a fluorinated resin (Teflon®). Teflon® coating may be applied either only on the surface of the jaws 171a to 171d of the guide 117 or on the entire surface of the guide 117.

The flexible bag 116 is composed of a rubber or resin. The method for fixing the seed crystal setting part 103 is not restricted to those as described above, and the part may be fixed by embedding it in the chamber.

Figure 9:
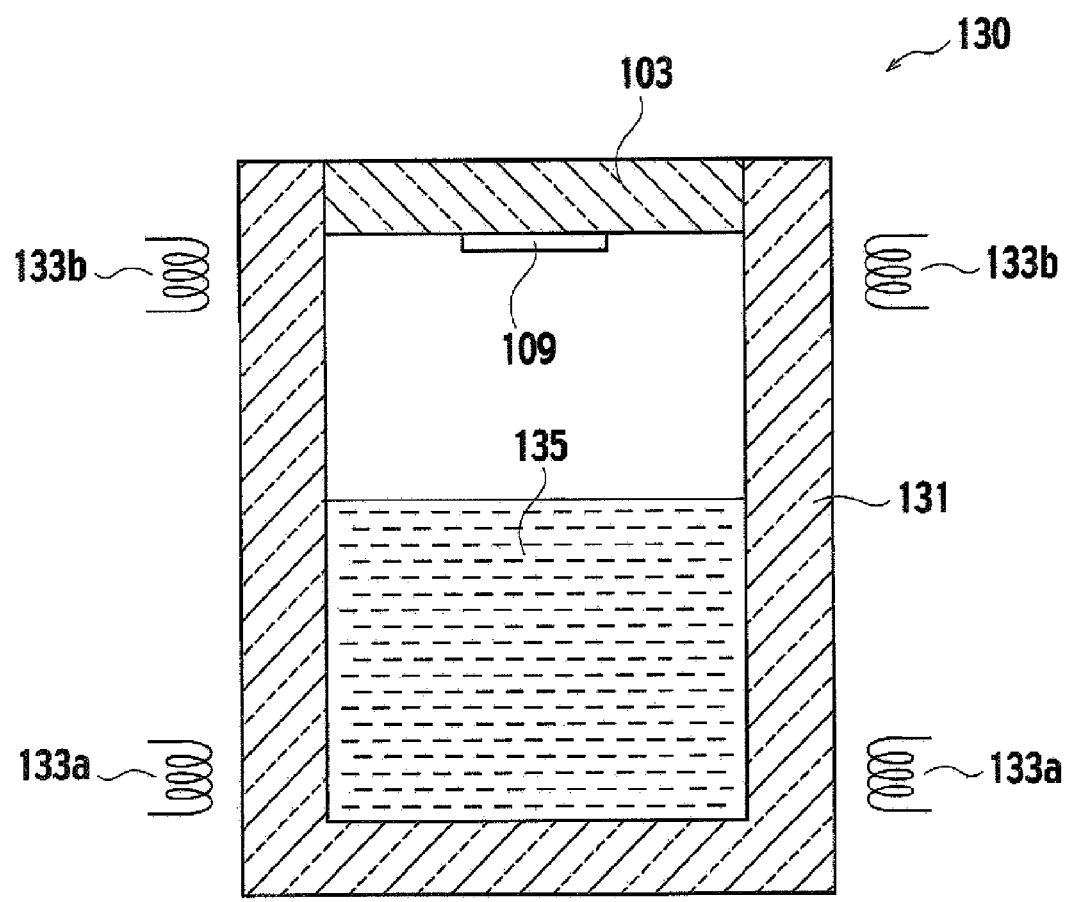
FIG. 9 shows a schematic illustration of a silicon carbide single crystal producing apparatus (a crucible).

A seed crystal setting part 103 of a silicon carbide single crystal producing apparatus 130 shown in FIG. 9 to be described below may be used as the seed crystal setting part 103 housed in the seed crystal fixing apparatus 101. While the seed crystal 109 may be appropriately determined depending on the object of use, Lely crystals of 6H—SiC and Acheson crystals of 6H—SiC can be used as the seed crystal. Examples of the adhesive 105 include resins, carbohydrates and heat resistant fine particles. Examples of the resin include heat curable resins such as phenol resin, novolac resin and furfuryl alcohol resin. The resin may comprise a carbon powder mixed with the phenol resin. Examples of the carbohydrate include sugars, for example monosaccharides such as glucose and polysaccharides such as cellulose, and derivatives thereof. Examples of the heat resistant fine particles include heat resistant substances such as graphite (carbon) as well as silicon carbide (SiC) and boron nitride (BN), and high melting-point metals such as tungsten and tantalum and compounds thereof such as carbides and nitrides.

First Embodiment of Method for Fixing Seed Crystal

The method for fixing the seed crystal according to this embodiment using the seed crystal fixing apparatus in FIGS. 1A and 1B will be described with reference to FIGS. 2, 3, 4, 5, 6, 7, and 8.

Figure 2:
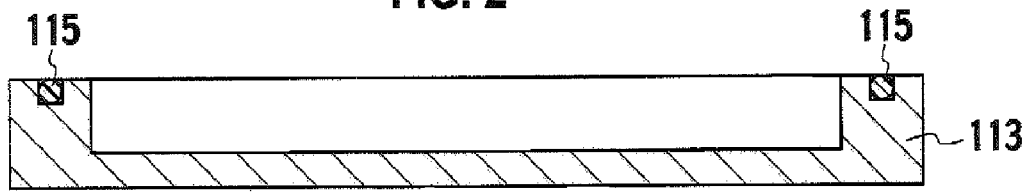
FIG. 2 to FIG. 8 show the steps for fixing the seed crystal.

(i) The lower chamber 113 as shown in FIG. 2 is prepared.

Figure 3:
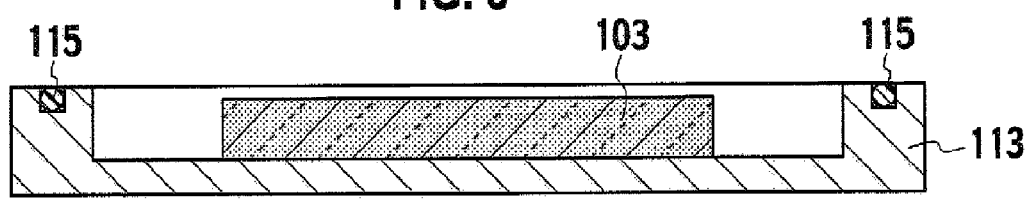

(ii) The seed crystal fixing part 103 of the reaction vessel is placed in the lower chamber 113 as shown in FIG. 3.

Figure 4:
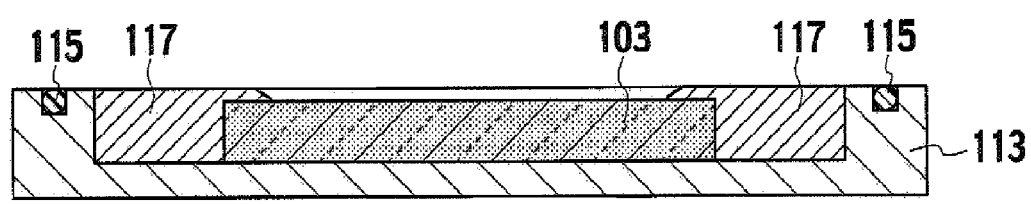

(iii) The seed crystal fixing part 103 is fixed with the guide 117 as shown in FIG. 4.

Figure 5:
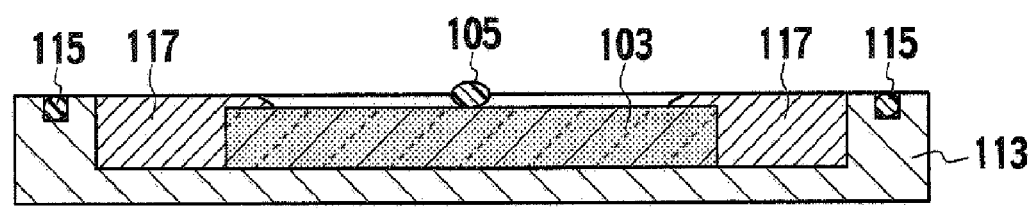

(iv) The adhesive 105 is applied on the seed crystal fixing part 103 except for the guide 117 as shown in FIG. 5. The amount of application is preferably in the range form 1 μl/cm² to 25 μl/cm².

Figure 6:
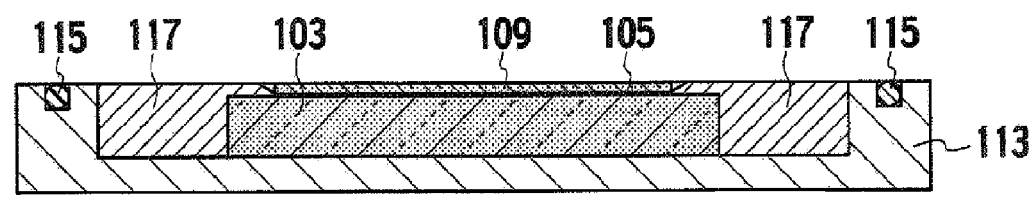

(v) Then, the seed crystal 109 is placed on the seed crystal fixing part 103 with interposition of the adhesive 105 as shown in FIG. 6. The surface of the seed crystal 109 to be in contact with the seed crystal fixing part 103 is preferably polished in advance for improving adhesiveness. Specifically, the surface roughness (Ra) of the contact face of the seed crystal 109 is preferably 0.1 μm or less. It is also preferable for improving adhesiveness to adjust the surface roughness (Ra) of the surface of the seed crystal fixing part 103 on which the seed crystal 109 is fixed is 1.4 μm or less.

Figure 7:
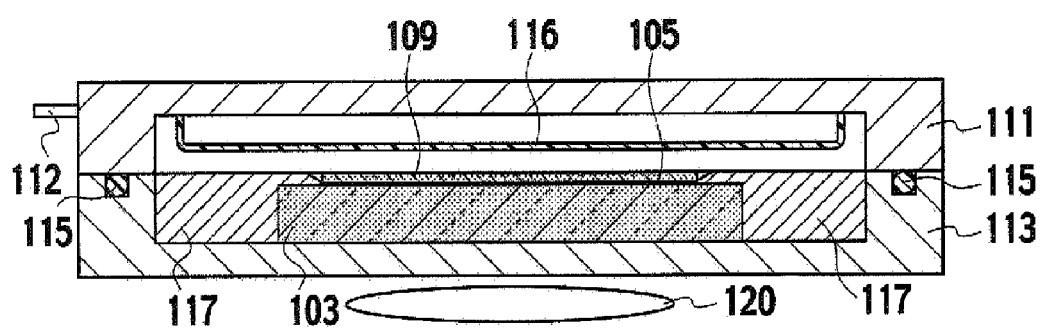

(vi) A hermetic atmosphere is formed by mounting the upper chamber 111 on the lower chamber 113 as shown in FIG. 7.

Figure 8:
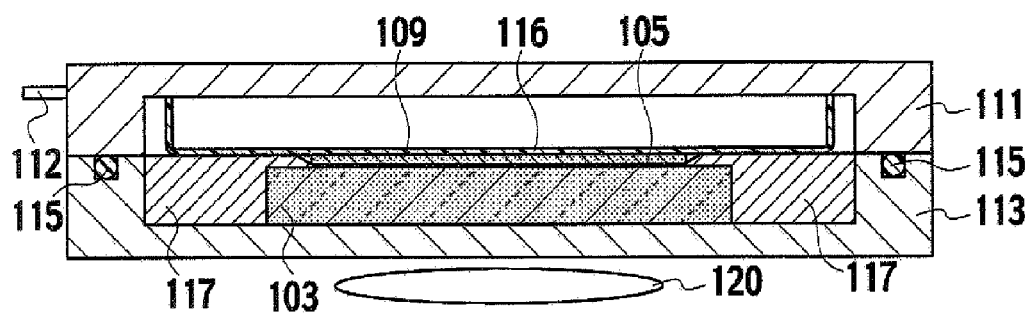

(vii) The flexible bag 116 is inflated by supplying a gas to the flexible bag as shown in FIG. 8. Then, a pressure is uniformly applied to the entire surface of the seed crystal 109 by allowing the flexible bag 116 to contact the seed crystal 109 on the opposite surface to the seed crystal fixing surface. The seed crystal is loaded with a pressure of preferably about 0.01 to 1 MPa.

(viii) The adhesive 105 is hardened by heating with a heating body 120. While the heating condition depends on the property of the adhesive (heat curable resin), the temperature is in the range from about 100° C. to about 1000° C., preferably about 100° C. to about 300° C. and is applied for about 5 to about 10 minutes.

A gas generated by hardening the adhesive 105 may cause irregular bonding when the gas is left behind between the seed crystal 109 and seed crystal fixing part 103 as bubbles. Accordingly, the gas that is considered to cause irregular bonding are evacuated from the chamber 110 using a vacuum pump (not shown) connected to the evacuation port 112, and the resin is preferably hardened while a reduced pressure atmosphere is formed. For forming the reduced pressure atmosphere, the reduced pressure atmosphere may be formed in advance to the step (vii), and the steps (vii) and (viii) are performed so as to obtain an effect for making the pressure applied on the seed crystal 109 uniform. Reproducibility of adhesiveness is improved by bonding under a constant condition throughout the steps. The pressure of this reduced pressure atmosphere is preferably about 300 Torr or less. The seed crystal 109 is fixed on the seed crystal fixing part 103 as described above.

Second Embodiment of Method for Fixing Seed Crystal

Figure 14B:
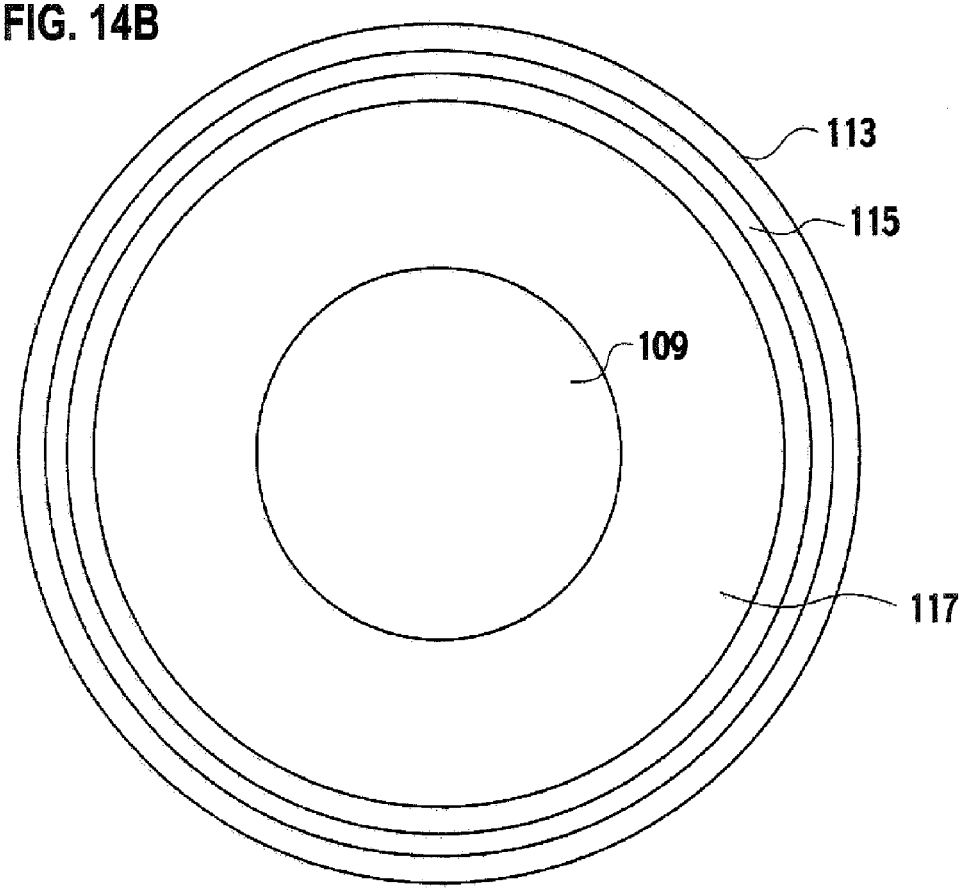
FIG. 14B shows a top view of the lower chamber.
Figure 15:
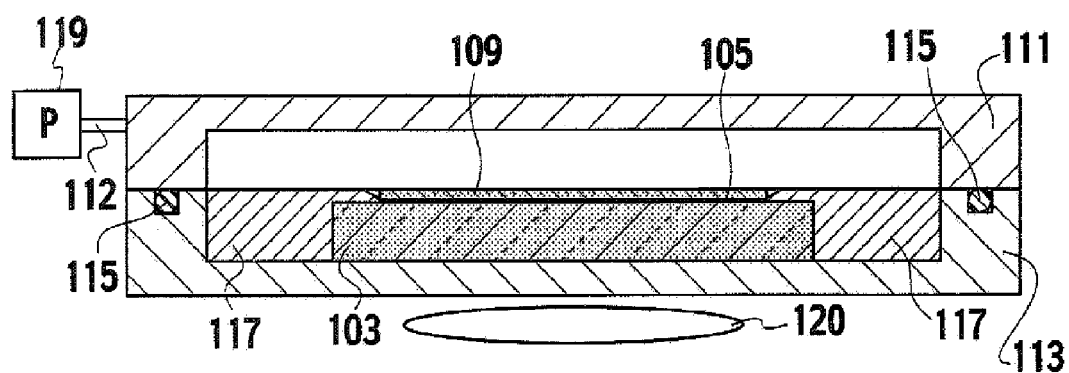
FIG. 15 shows the steps for fixing the seed crystal.

Second embodiment of the method for fixing the seed crystal using the seed crystal fixing apparatus in FIGS. 14A and 14B will be described with reference to FIGS. 2, 3, 4, 5, 6 and 15.

The seed crystal fixing apparatus 102 shown in FIG. 14 A is the same as the seed crystal fixing apparatus 101 shown in FIG. 1A except that a flexible bag 116 is not disposed within the chamber 110, an evacuation part 119 is connected to the chamber 110 for forming a reduced pressure within the chamber 110.

(i) Proceed the steps (i) to (v) as shown in FIGS. 2 to 6 in the same manner in the first embodiment of the method for fixing the seed crystal.

(ii) Form the reduced pressure atmosphere in the chamber 110 by evacuating the air with the absorbing part 119 as shown in FIG. 14. The pressure of the reduced atmosphere is preferably about 300 Torr or less.

(iii) The adhesive 105 is hardened by heating with a heating body 120 in the same manner as the steps (viii) in the first embodiment of the method for fixing the seed crystal.

Other Embodiments

As described above, while the present invention has been described according to the embodiments, the descriptions and the drawings configuring a part of this disclosure do not limit the scope of the present invention. This disclosure allows those skilled in the arts to know a variety of substitutive embodiments, working examples and operational techniques. While the embodiment of the method for fixing seed crystal is disclosed as an example, a silicon carbide single crystal and a method of producing for them may be provided.

Therefore, the present invention naturally includes a variety of embodiments not described herein. Accordingly, the scope of the present invention should be determined only based on specific descriptions in the claims reasonable from the aforementioned descriptions.

(A Method of Producing a Silicon Carbide Single Crystal)

Another aspect of this invention, a method of producing a silicon carbide single crystal is provided. Thus, this invention relates to a method of producing a silicon carbide single crystal having: storing a sublimation law material on a first end portion in a reaction container; disposing a seed crystal of a silicon carbide single crystal on a second end portion substantially facing the sublimation law material in the reaction container; and re-crystallizing the sublimated sublimation law material on the seed crystal to grow a silicon carbide single crystal, wherein a seed crystal is fixed on a seed crystal fixing part of the second end portion by the above embodiment of the method of fixing the seed crystal.

The production apparatus to be used for the method of producing a silicon carbide single crystal is not particularly limited, as an embodiment of a silicon carbide single crystal production apparatus, an apparatus 130 shown in FIG. 3 can be used.

The apparatus 130 shown in FIG. 3 has a reaction container main body 131 capable of storing a sublimation law material 135; a lid portion 103 provided detachably to the reaction container main body 131 and capable of placing a silicon carbide single crystal 109. The apparatus 130 has further, a first induction heating coil 133a disposed in a spirally wound state on the outer circumference of the portion for storing the sublimation law material 135 in the crucible for forming the atmosphere for sublimating the sublimation law material; and a second induction heating coil 133b for disposed in a spirally wound state on the outer circumference of the portion for storing the seed crystal 109 in the crucible for forming the re-crystallization atmosphere for re-crystallizing the sublimation law material 135 sublimated by the first induction heating coil 133a only in the vicinity of the seed crystal 109 of the silicon carbide single crystal for re-crystallizing the sublimation law material 135 on the seed crystal 109 of the silicon carbide single crystal can be presented. In this case, it is advantageous in that the grown silicon carbide single crystal can easily be separated from the reaction container only by detaching the lid portion 103 mounted on the second end portion (seed crystal placing portion) and the sealing portion.

The reaction container main body 131 is not particularly limited as long as it has the function of storing the sublimation law material 135 so that any known one can be used.

As the lid portion 103, one provided detachably to the reaction container main body 131 is preferable, and known one can be used. The reaction container main body 131 and the lid portion 103 can be designed detachably by fitting, screwing, or the like, but one provided by screwing is preferable.

The material of the reaction container main body 131 and the lid portion 103 comprising the crucible as the reaction container 130 is not particularly limited, and it can be selected optionally from the known ones, however, one made of a graphite is particularly preferable. It is more preferable that the thermal expansion coefficient of the material of the reaction container main body 131 and the lid portion 103 is substantially the same as that of the seed crystal 109.

—Sublimation Raw Material—

Regarding the above-mentioned sublimation raw material 135, the polymorphs of a crystal, use amount, purity, its production method and the like are not particularly restricted as long as the material is made of silicon carbide, and can be appropriately selected depending on the object.

As the polymorphs of a crystal of the above-mentioned sublimation raw material, for example, 4H, 6H, 15R, 3C and the like listed, and among them, 6H and the like are suitably listed. These are preferably used alone, however, two or more of them may be used in combination.

The use amount of the above-mentioned sublimation raw material can be appropriately selected depending on the size of a silicon carbide single crystal produced, the size of the above-mentioned reaction container, and the like.

The purity of the above-mentioned sublimation raw material is preferably higher from the standpoint of preventing contamination of polycrystals and polymorphs into a silicon carbide single crystal produced as much as possible, and specifically, it is preferable that the content of each impurity element is 0.5 ppm or less.

Here, the content of the above-mentioned impurity elements is impurity content by chemical analysis, and only means a reference values, and practically, evaluation differs depending on whether the above-mentioned impurity elements are uniformly distributed in the above-mentioned silicon carbide single crystal or not, or whether they are localized or not. Here, "impurity element" means elements belonging to Groups I to XVII in the Periodic Table according to 1989, IUPAC Inorganic Chemical Nomenclature Revision and at the same time having an atomic number of 3 or more (excluding carbon atom, oxygen atom and silicon atom). When dopant elements such as nitrogen, aluminum and the like are added by intention for imparting n-type or p-type conductivity to a silicon carbide single crystal to be grown, these elements are also excluded.

A silicon carbide powder as the above-mentioned sublimation raw material is obtained, for example, by dissolving at least one silicon compound as a silicon source, at least one organic compound generating carbon by heating as a carbon source, and a polymerization catalyst or cross-linking catalyst in a solvent and drying the resulted solution to give a powder, and calcinating the resulted powder under a non-oxidating atmosphere.

As the above-mentioned silicon compound, liquid compounds and solid compounds can be used together, however, at least one compound is selected from liquid compounds.

As the above-mentioned liquid compound, alkoxysilanes and alkoxysilane polymers are suitably used.

As the above-mentioned alkoxysilane, for example, methoxysilane, ethoxysilane, propoxysilane, butoxysilane and the like are listed, and among them, ethoxysilane is preferable from the standpoint of handling.

The above-mentioned alkoxysilane may be any of monoalkoxysilanes, dialkoxysilane, trialkoxysilane and tetraalkoxysilane, and tetraalkoxysilanes are preferable.

As the above-mentioned alkoxysilane polymer, lower molecular weight polymers (oligomers) having a degree of polymerization of from about 2 to 15 and silicic acid polymers are listed. For example, a tetraethoxysilane oligomer is mentioned.

As the above-mentioned solid compound, silicon oxides such as SiO, silica sol (colloidal ultrafine silica-containing liquid, having an OH group and alkoxyl group inside), silicon dioxides (silica gel, fine silica, quartz powder) and the like are listed.

The above-mentioned silicon compounds may be used alone or in combination of two or more.

Among the above-mentioned silicon compounds, a tetraethoxysilane oligomer, a mixture of a tetraethoxysilane oligomer and fine powdery silica, and the like are preferable from the standpoint of excellent uniformity and handling property.

The above-mentioned silicon compound preferably has high purity, and the content of each impurity at the initial period is preferably 20 ppm or less, more preferably 5 ppm or less.

As the above-mentioned organic compound generating carbon by heating, a liquid organic compound may be used alone and a liquid organic compound and a solid organic compound may be used together.

As the above-mentioned organic compound generating carbon by heating, organic compounds manifesting high carbon-remaining ratio and being polymerized or crosslinked by a catalyst or heat are preferable, and for example, monomers and prepolymers of phenol resins, furan resins, resins such as polyimides, polyurethanes, polyvinyl alcohol and the like, are preferable, and additionally, liquid substances such as cellulose, sucrose, pitch, tar and the like are mentioned. Among them, those of high purity are preferable, phenol resins are more preferable, and resol type phenol resins are particularly preferable.

The above-mentioned organic compound generating carbon by heating may be used alone or in combination of two or more.

The purity of the above-mentioned organic compound generating carbon by heating can be appropriately selected depending on the object, and when a high purity silicon carbide powder is necessary, it is preferable to use organic compounds in which the content of each metal is not 5 ppm or more.

The above-mentioned polymerization catalyst and crosslinking catalyst can be appropriately selected depending on the above-mentioned organic compound generating carbon by heating, and when the above-mentioned organic compound generating carbon by heating is a phenol resin or furan resin, acids such as toluenesulfonic acid, toluenecarboxylic acid, acetic acid, oxalic acid, maleic acid, sulfuric acid and the like are preferable, and maleic acid is particularly preferable.

The ratio of carbon contained in the above-mentioned organic compound generating carbon by heating to silicon contained in the above-mentioned silicon compound (hereinafter, abbreviated as C/Si ratio) is defined by element-analyzing a carbide intermediate obtained by carbonizing a mixture of them at 1000° C. Stoichiometrically, the content of free carbon in a silicon carbide powder obtained when the above-mentioned C/Si ratio is 3.0 should be 0%, however, free carbon generates at lower C/Si ratio by vaporization of a simultaneously produced SiO gas, actually. It is preferable to previously determine the compounding ratio so that the amount of free carbon in the resulted silicon carbide powder is suitable amount. Usually, by calcinations at 1600° C. or higher at around 1 atm, free carbon can be controlled when the above-mentioned C/Si ratio is 2.0 to 2.5. When the above-mentioned C/Si ratio is over 2.5, the above-mentioned free carbon increases remarkably. However, when calcinations is conducted at lower atmosphere pressure or higher atmosphere pressure, the C/Si ratio for obtaining a pure silicon carbide powder varies, therefore, the ratio is not necessarily limited in the above-mentioned C/Si range, in this case.

The above-mentioned silicon carbide powder is obtained also by hardening a mixture of the above-mentioned silicon compound and the above-mentioned organic compound generating carbon by heating, for example.

As the above-mentioned hardening method, a method of hardening by heating, a method of hardening by a hardening catalyst, methods using electronic beam and radiation, and the like are listed.

The above-mentioned hardening catalyst can be appropriately selected depending on the kind of the above-mentioned organic compound generating carbon by heating, and the like, and in the case of a phenol resin or furan resin, acids such as toluenesulfonic acid, toluenecarboxylic acid, acetic acid, oxalic acid, hydrochloric acid, sulfuric acid, maleic acid and the like, amic acids such as hexamine, and the like are suitably listed. When these hardening catalysts are used, the hardening catalyst is dissolved or dispersed in a solvent. As the above-mentioned catalyst, lower alcohols (for example, ethyl alcohol and the like), ethylether, acetone and the like are listed.

A silicon carbide powder obtained as described above is calcinated in a non-oxidizing atmosphere such as nitrogen, argon and the like at 800 to 1000° C. for 30 to 120 minutes.

By the above-mentioned calcinations, the above-mentioned silicon carbide powder becomes a carbide, and by calcinating this carbide in a non-oxidizing atmosphere such as argon and the like at 1350 to 2000° C., a silicon carbide powder is produced.

The temperature and time of the above-mentioned calcinations can be appropriately selected depending on the granular size of a silicon carbide powder to be obtained, and the above-mentioned temperature is preferably from 1600 to 1900° C. from the standpoint of more effective production of a silicon carbide powder.

For the purpose of removing impurities and obtaining a high purity silicon carbide powder, after the above-mentioned calcinations, it is preferable to conduct heat treatment at 2000 to 2400° C. for 3 to 8 hours.

Since the silicon carbide powder obtained as described above has non-uniform size, given particle size can be obtained by powder destruction, classification and the like.

The average particle size of the above-mentioned silicon carbide powder is preferably from 10 to 700 µm, more preferably from 100 to 400 µm.

When the above-mentioned average particle size is less than 10 µm, sintering occurs quickly at the sublimation temperature (1800 to 2700° C.) of silicon carbide for growing a silicon carbide single crystal, therefore, sublimation surface area decreases and growth of a silicon carbide single crystal delays, in some cases, and when a silicon carbide powder is accommodated in the above-mentioned reaction container and when the pressure of a re-crystallization atmosphere is changed for control of the growth speed, a silicon carbide powder is splashed easily. On the other hand, when the above-mentioned average particle size is over 500 µm, the specific surface area of a silicon carbide powder itself decreases, therefore, growth of a silicon carbide single crystal may delay also in this case.

As the above-mentioned silicon carbide powder, any of 4H, 6H, 15R, 3C and mixtures of them may be used. The grade of the above-mentioned 3C silicon carbide powder is not particularly restricted, and those generally marketed may be permissible, however, those of high purity are preferable.

Further, nitrogen or aluminum and the like can be introduced into a silicon carbide single crystal grown using the above-mentioned silicon carbide powder for the purpose of giving n type or p type conductivity, and when nitrogen or aluminum is introduced in generating the above-mentioned silicon carbide powder, it is recommendable that, first, the above-mentioned silicon source, the above-mentioned carbon source, an organic substance composed of a nitrogen source or aluminum source, the above-mentioned polymerization catalyst or crosslinking catalyst are uniformly mixed. In this case, it is preferable that, for example, when a carbon source such as phenol resins and the like, an organic substance composed of a nitrogen source such as hexamethylenetetramine and the like and a polymerization or crosslinking catalyst such as maleic acid and the like are dissolved in a solvent such as ethanol and the like, they are mixed sufficiently with a silicon source such as a tetraethoxysilane oligomer and the like.

As the above-mentioned organic substance composed of a nitrogen source, substances generating nitrogen by heating are preferable, and listed are, for example, polymer compounds (specifically, polyimide resins, nylon resins and the like), various amines such as organic amines (specifically, hexamethylenetetramine, ammonia, triethylamine, and the like, and compounds and salts of them). Of them, hexamethylenetetramine is preferable. A phenol resin synthesized using hexamine as a catalyst and containing nitrogen derived from this synthesis process in an amount of 2.0 mmol or more based on 1 g of the resin can also be suitably used as the organic substance composed of a nitrogen source. These organic substances composed of a nitrogen source may be used alone or in combination of two or more. The above-mentioned organic substance composed of an aluminum source is not particularly restricted and can be appropriately selected depending on the object.

Regarding the addition amount of the above-mentioned organic substance composed of a nitrogen source, when the above-mentioned silicon source and the above-mentioned carbon source are added simultaneously, nitrogen is contained in an amount of preferably 1 mmol or more based on 1 g of the above-mentioned silicon source, and the organic substance is added in an amount of 80 to 1000 µg based on 1 g of the above-mentioned silicon source.

The materials for sublimation in the production of a silicon carbide single crystal can be presented more specifically as follows. As the sublimation law material, it is preferable to use carbonized silicon powders obtained by heating a mixture obtained by evenly mixing a high purity alkoxy silane as the silicon source and a high purity organic compound to produce a carbon by heating as the carbon source, heating and baking the same under a non oxidizing atmosphere. Moreover, as the sublimation law material, it is preferable to use carbonized silicon powders obtained by heating a mixture obtained by evenly mixing a high purity alkoxy silane and a high purity alkoxy silane copolymer as the silicon source and a high purity organic compound to produce a carbon by heating as the carbon source, heating and baking the same under a non oxidizing atmosphere. Moreover, as the sublimation law material, it is preferable to use carbonized silicon powders obtained by heating a mixture obtained by evenly mixing at least one selected from the group consisting of a high purity methoxy silane, a high purity ethoxy silane, a high purity propoxy silane and a high purity butoxy silane as the silicon source and a high purity organic compound to produce a carbon by heating as the carbon source, heating and baking the same under a non oxidizing atmosphere. Furthermore, as the sublimation law material, it is preferable to use carbonized silicon powders obtained by heating a mixture obtained by evenly mixing at least one selected from the group consisting of a high purity methoxy silane, a high purity ethoxy silane, a high purity propoxy silane, a high purity butoxy silane and a polymer thereof having a 2 to 15 polymerization degree as the silicon source and a high purity organic compound to produce a carbon by heating as the carbon source, heating and baking the same under a non oxidizing atmosphere. As the sublimation law material, it is preferable to use carbonized silicon powders obtained by heating a mixture obtained by evenly mixing at least one selected from the group consisting of a high purity monoalkoxy silane, a high purity dialkoxy silane, a high purity trialkoxy silane, a high purity tetraalkoxy silane and a polymer thereof having a 2 to 15 polymerization degree as the silicon source and a high purity organic compound to produce a carbon by heating as the carbon source, heating and baking the same under a non oxidizing atmosphere.

(Silicon Carbide Single Crystal)

The silicon carbide single crystal is produced by the method for producing the silicon carbide single crystal as described above. The silicon carbide single crystal has crystal defects (tubular defects) of 50 defects/$cm^2$ or less, preferably 10 defects/$cm^2$ or less, as evaluated by etching with a molten alkali. The total content of metal impurity elements in the silicon carbide single crystal is preferably 10 ppm or less. Since the silicon carbide single crystal obtained in the invention has a quite high quality without mingling of polycrystals and polymorphic crystals and without crystal defects such as micro-pipes, it is excellent in dielectric breakdown resistance, heat resistance and radiation resistance, and may be favorably used for electronic devices such as semiconductor wafers and optical devices such as light emission diodes.

According to the aforementioned method for producing the silicon carbide single crystal of the invention, a high quality silicon carbide single crystal can be readily and efficiently produced without causing damages such as cracks.

EXAMPLE

The following examples illustrate the present invention, but do not limit the scope of the invention at all.

Example

Figure 11:
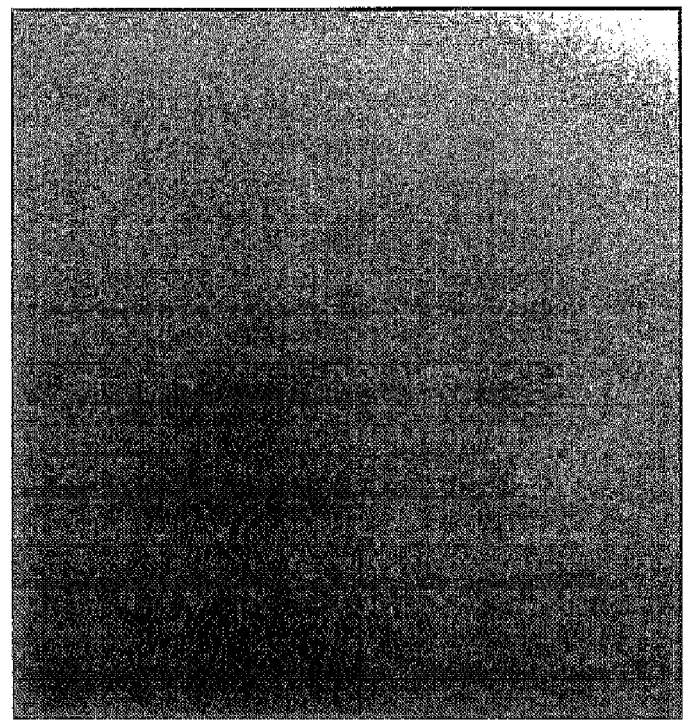
FIG. 11 shows a magnified photograph of the surface of the silicon carbide single crystal obtained in the example.

The seed crystal 109 was fixed on the seed crystal fixing part 103 according to the method for fixing the seed crystal of the invention using the seed crystal fixing apparatus shown in FIGS. 1A, 1B. A phenol resin was applied as the adhesive 105 at a density of 7.5 µl/$cm^2$. The seed crystal 109 used was a Lely crystal of 6H—SiC with a thickness of 0.4 mm and a diameter of 50 mm. The seed crystal was heated to 90° C. in 15 minutes under a reduced pressure (30 Torr). After additional pre-heating at 90° C. for 2 minutes, the seed crystal was heated to 160° C. in 25 minutes and heated at 160° C. for 10 minutes to harden the adhesive. As shown in the surface observation photograph in FIG. 11, it was confirmed that the seed crystal 109 of this example was bonded without any irregular bonding.

The seed crystal fixing part 103 on which the seed crystal 109 was fixed was mounted on the silicon carbide single crystal producing apparatus 130 to permit the silicon carbide single crystal to grow on the seed crystal. A sublimation material 135 contains a high purity tetraethoxysilane polymer as a silicon source and a phenol resin of a resol type as a carbon source. These materials were uniformly mixed, and the mixture was calcinated by heating in an argon atmosphere to obtain a silicon carbide powder (6H—SiC partly containing 3C—SiC; average particle diameter 200 μm), which was used as the sublimation material 135. An electric current was flowed through a first induction heating coil 133a in the silicon carbide single crystal producing apparatus 130 to heat the coil, and the sublimation material 135 was heated with the coil. In this process, the bottom of the reaction vessel 31 was heated at 2350° C., and the argon gas atmosphere in the vessel was maintained at a pressure of 50 Torr (6645 Pa). The sublimation material 135 was sublimated by being heated at a predetermined temperature (2540° C.). The seed crystal fixing part 103 was heated with a second induction heating coil 33b. The temperature of the seed crystal fixing part 103 after heating with the second induction heating coil 33b was adjusted to 2300° C.

An observation of the cross section of the wafer of the silicon carbide single crystal (FIG. 11) showed that the number of macroscopic defects on the entire surface immediately above the seed crystal was 10 or less, while the number of the macroscopic defects 10 mm above the surface of the seed crystal was zero. The size of the defect was smaller than that observed in the single crystal obtained by the conventional method.

Comparative Example

Figure 13:
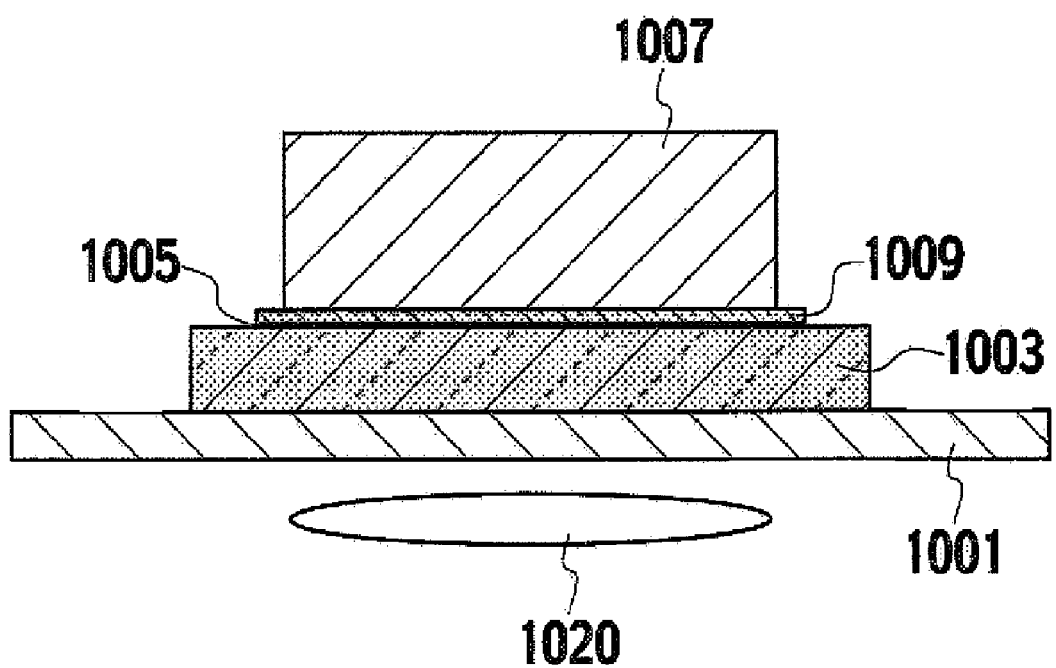
FIG. 13 shows a schematic illustration of a conventional method for fixing the seed crystal.

A seed crystal fixing part 1003 was placed on a mounting table 1001 as shown in FIG. 13, and a seed crystal 1009 was fixed thereon with interposition of an adhesive (phenol resin) 1005. A weight 1007 was loaded on the seed crystal 1009, and the phenol resin was hardened by heating at 300° C. for 0.5 hour while the seed crystal 1009 is loaded with the weight 1007. As shown in the surface observation photograph of the seed crystal in FIG. 10, irregular bonding was found on the surface of the seed crystal 1009 in the comparative example.

A silicon carbide single crystal was grown by the same method as in the example using the seed crystal 1009.

An observation of the vertical cross section (FIG. 10) of the silicon carbide single crystal obtained showed that the number of macroscopic defects on the entire surface of the single crystal immediately above the seed crystal was 100 or less, while the number of the macroscopic defects 10 mm above the surface of the seed crystal was 10 to 20. The size of the macroscopic defect was larger than that in the example.

According to the present invention, a silicon carbide single crystal which has a small content of impurity elements, also has a small content of elements such as nitrogen and the like other than the impurity elements, can be suitably used as a p-type semiconductor and the like, and a method of producing a silicon carbide single crystal which can produce this silicon carbide single crystal efficiently, can be provided.

What is claimed is:

1. A seed crystal fixing apparatus for fixing the seed crystal on the seed crystal setting part of a reaction vessel with interposition of the adhesive, comprising:
    a chamber configured to place the seed crystal setting part and form a hermetic atmosphere within the chamber; and
    a pressure part placed within the chamber for uniformly applying a pressure on the entire surface of the seed crystal;
    wherein the chamber has an upper chamber and a lower chamber configured to form a hermetic atmosphere when the upper chamber is mounted on the lower chamber, and
    the pressure part is a flexible bag placed within the chamber for inflation and deflation upon charge and discharge of an air and for uniformly applying a pressure on the entire surface of the seed crystal in contact with the surface of the seed crystal upon inflation.

2. The seed crystal fixing apparatus according to the claim 1, wherein the lower chamber has a guide for fixing the seed crystal setting part and the seed crystal.

3. The seed crystal fixing apparatus according to claim 2, wherein the guide contacts the side face of the seed crystal at least at three points.

4. The seed crystal fixing apparatus according to the claim 1, wherein the flexible bag is composed of a rubber or resin.

5. The seed crystal fixing apparatus according to the claim 1 further comprising an evacuating part configured to evacuate gas within the chamber to form a reduced pressure within the chamber.

6. The seed crystal fixing apparatus according to the claim 1 further comprising a heating body for hardening the adhesive by heating.

* * * * *